United States Patent
Nakayama et al.

(10) Patent No.: US 10,836,048 B2
(45) Date of Patent: Nov. 17, 2020

(54) SUCTION PAD

(71) Applicant: SMC CORPORATION, Chiyoda-ku (JP)

(72) Inventors: Toru Nakayama, Soka (JP); Toru Sugiyama, Abiko (JP); Noriyuki Miyazaki, Kashiwa (JP); Masaru Saitoh, Joso (JP); Yukiya Goto, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 16/529,980

(22) Filed: Aug. 2, 2019

(65) Prior Publication Data
US 2020/0047352 A1 Feb. 13, 2020

(30) Foreign Application Priority Data
Aug. 8, 2018 (JP) .................................. 2018-149076

(51) Int. Cl.
*B25J 15/06* (2006.01)
*B65G 47/91* (2006.01)

(52) U.S. Cl.
CPC .......... *B25J 15/0683* (2013.01); *B65G 47/91* (2013.01)

(58) Field of Classification Search
CPC .............................. B25J 15/0683; B65G 47/91
See application file for complete search history.

(56) References Cited

U.S. PATENT DOCUMENTS

| | | | | |
|---|---|---|---|---|
| 6,502,877 B2 * | 1/2003 | Schick | ..................... | B25J 15/06 294/185 |
| 6,979,032 B2 * | 12/2005 | Damhuis | .............. | B25J 15/0052 294/185 |
| 7,000,964 B1 * | 2/2006 | Porras | .................. | B25J 15/0616 294/186 |

(Continued)

FOREIGN PATENT DOCUMENTS

| | | |
|---|---|---|
| JP | 8-229865 A | 9/1996 |
| JP | 2018-65194 A | 4/2018 |

OTHER PUBLICATIONS

Extended European Search Report dated Jan. 13, 2020, in Patent Application No. 19190070.3, 8 pages.

*Primary Examiner* — Stephen A Vu
(74) *Attorney, Agent, or Firm* — Oblon, McClelland, Maier & Neustadt, L.L.P.

(57) ABSTRACT

A suction device includes an adapter having a supply passage to which a negative pressure fluid is supplied, a bellows connected to a lower end of the adapter, and a pad member formed at the distal end of the bellows. The pad member has plural first and second ribs on a suction surface that attracts a workpiece under suction. The first ribs are disposed on an outer circumferential side of an attachment provided in the center of the pad member and extend toward the outer circumferential side. The second ribs are provided on an outer circumferential side of the first ribs, and are disposed in a circumferentially offset manner with respect to the first ribs. Additionally, between the respective first ribs which are disposed alongside one another in the circumferential direction of a skirt, supply paths are formed to which the negative pressure fluid is supplied from the attachment.

9 Claims, 9 Drawing Sheets

(56) References Cited

U.S. PATENT DOCUMENTS

| | | | | |
|---|---|---|---|---|
| 7,374,217 B2* | 5/2008 | Pabst | ................... | B65G 47/91 |
| | | | | 251/339 |
| 7,631,912 B2* | 12/2009 | Hupp | ................... | B66C 1/0212 |
| | | | | 277/650 |
| 2002/0011735 A1 | 1/2002 | Nagai et al. | | |

* cited by examiner

SUCTION PAD

CROSS-REFERENCE TO RELATED APPLICATION

This application is based upon and claims the benefit of priority from Japanese Patent Application No. 2018-149076 filed on Aug. 8, 2018, the contents all of which are incorporated herein by reference.

BACKGROUND OF THE INVENTION

Field of the Invention

The present invention relates to a suction pad used in a suction device capable of attracting under suction and transporting a workpiece under a supply action of a negative pressure fluid.

Description of the Related Art

Heretofore, a suction device has been known in which there is included a suction pad for attracting under suction and transporting a workpiece by a supplied negative pressure fluid. In such a suction device, in the case of transporting a workpiece which is formed from a film in a bag shape and is filled with fluid contents, when the contents move inside the workpiece and the workpiece becomes deformed, the suction pad cannot follow along with the deformation, and the suction applied to the workpiece becomes defective.

Thus, in order to solve the aforementioned problem, for example, in the suction pad disclosed in Japanese Laid-Open Patent Publication No. 2018-065194, there are provided a support body having a suction path in the center thereof, and a skirt member disposed on a lower part of the support body and which contacts the workpiece. The skirt member is formed in a truncated conical shape, and in an interior space thereof, a plurality of rib portions are provided that extend radially from the center toward an outer circumferential side, and project toward the workpiece.

In the interior space of the skirt member, the suction path to which a negative pressure fluid is supplied opens in the center thereof, and convex surface portions, which are fan-shaped in cross section, are formed to project toward the workpiece at positions facing the suction path on respective inner sides of the rib portions.

In addition, when the bag-shaped workpiece having the contents filled in the interior thereof is attracted under suction with the suction pad, by placing an inclined surface of the skirt member in close contact with a surface of the workpiece, and supplying the negative pressure fluid to the internal space through the suction path, the skirt member is elastically deformed in close contact with the surface of the workpiece, and by the negative pressure fluid passing between the convex surface portions and being supplied between the respective rib portions, the workpiece is attracted under suction.

SUMMARY OF THE INVENTION

However, with the suction pad discussed above, when the workpiece is deformed due to flowing of the contents therein or the like at the time that the workpiece is attracted under suction, the negative pressure fluid, which is supplied to the outer circumferential side of the skirt member between the convex surface portions and flows between the rib portions, flows in a linear manner toward the outer circumferential side, and there is a concern that the negative pressure fluid may leak to the exterior from the outer circumferential sides of opened rib portions, thus leading to a decrease in suction power and bringing about a suction defect.

A general object of the present invention is to provide a suction pad which is capable of reliably and stably attracting a workpiece under suction, by causing the suction pad to follow a workpiece having a bag shape that undergoes deformation by flowing of the contents therein.

An aspect of the present invention is characterized by a suction pad configured to be fixed to an end of a body having therein a passage to which a negative pressure fluid is supplied, the suction pad including ribs on a suction surface of a suction member to which a workpiece is attracted under suction, the ribs including:

a plurality of first rib portions configured to project toward the workpiece, wherein the first rib portions are formed on an outer circumferential side of the passage, and extend radially outward; and a plurality of second rib portions formed on outer circumferential sides of the first rib portions, and which are disposed in a circumferentially offset manner with respect to the first rib portions;

wherein supply paths through which the negative pressure fluid flows are formed between adjacent ones of the first rib portions, and at least parts of the second rib portions are disposed so as to face toward directions in which the supply paths extend.

According to the present invention, the suction surface of the suction pad that attracts the workpiece under suction includes the ribs that project toward the workpiece. The ribs include the plurality of first rib portions which are formed on the outer circumferential side of the passage formed in the body, and extend radially outward, and the plurality of second rib portions which are formed on the outer circumferential side of the first rib portions, and are disposed in a circumferentially offset manner with respect to the first rib portions. The supply paths through which the negative pressure fluid flows are formed between adjacent ones of the first rib portions.

In addition, for example, when a bag-shaped workpiece in which fluid contents are contained is attracted under suction and transported by the suction pad, even in the case that the shape of the workpiece changes due to movement of the contents or under the influence of gravity or the like, the suction pad is deformed in a manner so as to follow the shape of the workpiece, and by the first rib portions and the second rib portions being kept in abutment with the workpiece accompanying such deformation, the supply paths are surrounded by the first and second rib portions, and the negative pressure fluid can suitably be maintained in the interior of the supply paths. Further, since the supply paths of the negative pressure fluid are configured in a non-linear shape by the first and second rib portions in radial directions of the suction pad, leakage of the negative pressure fluid to the exterior can be prevented, in comparison with the suction pad according to the conventional art.

Accordingly, even in the case that the shape of the workpiece being attracted under suction changes, the suction pad is deformed so as to follow the changed shape, and the workpiece is reliably attracted under suction with a stable suction force by the negative pressure fluid that is retained in the supply paths.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

Figure 1:
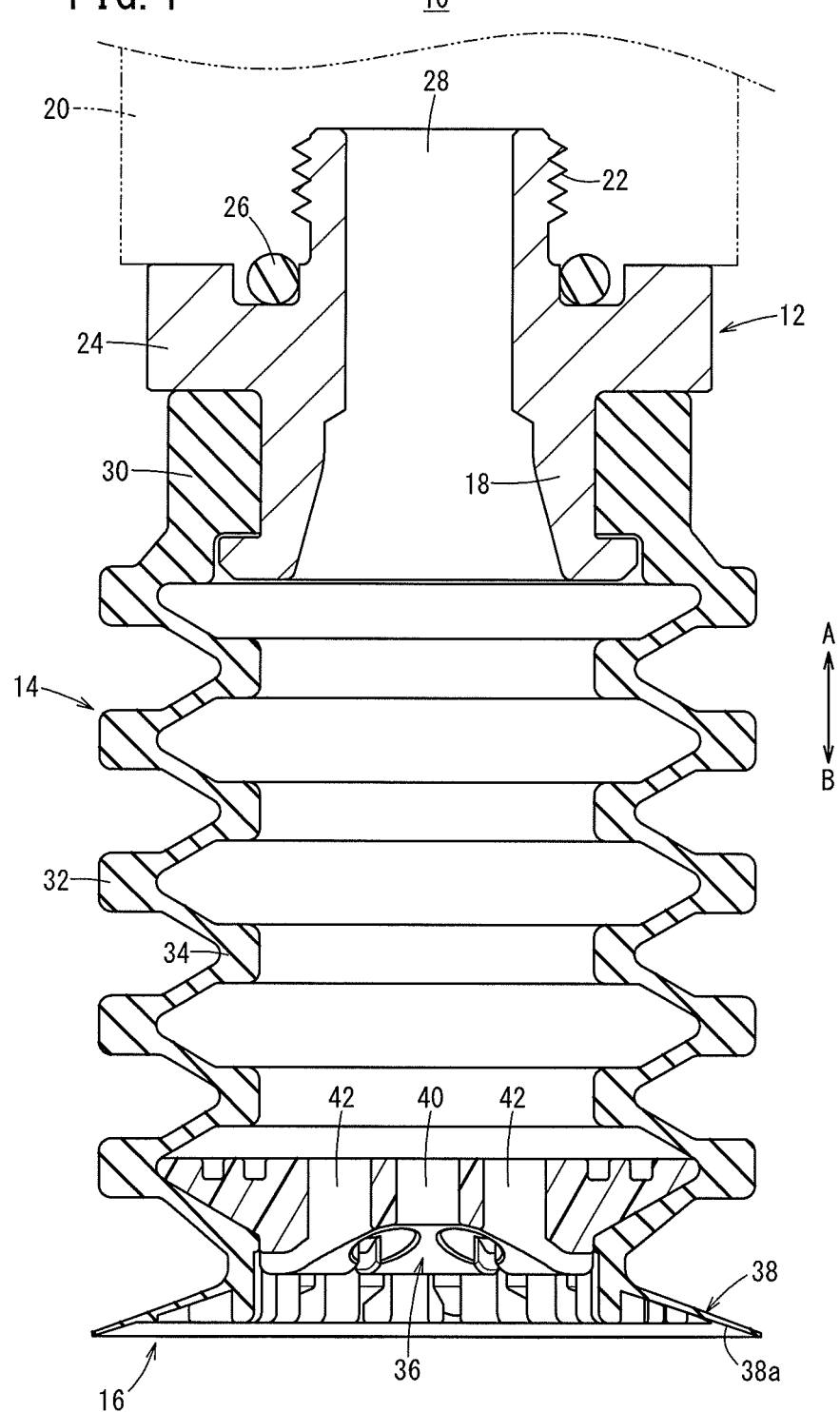
FIG. 1 is an overall cross-sectional view of a suction device including a suction pad according to a first embodiment of the present invention.
Figure 2:
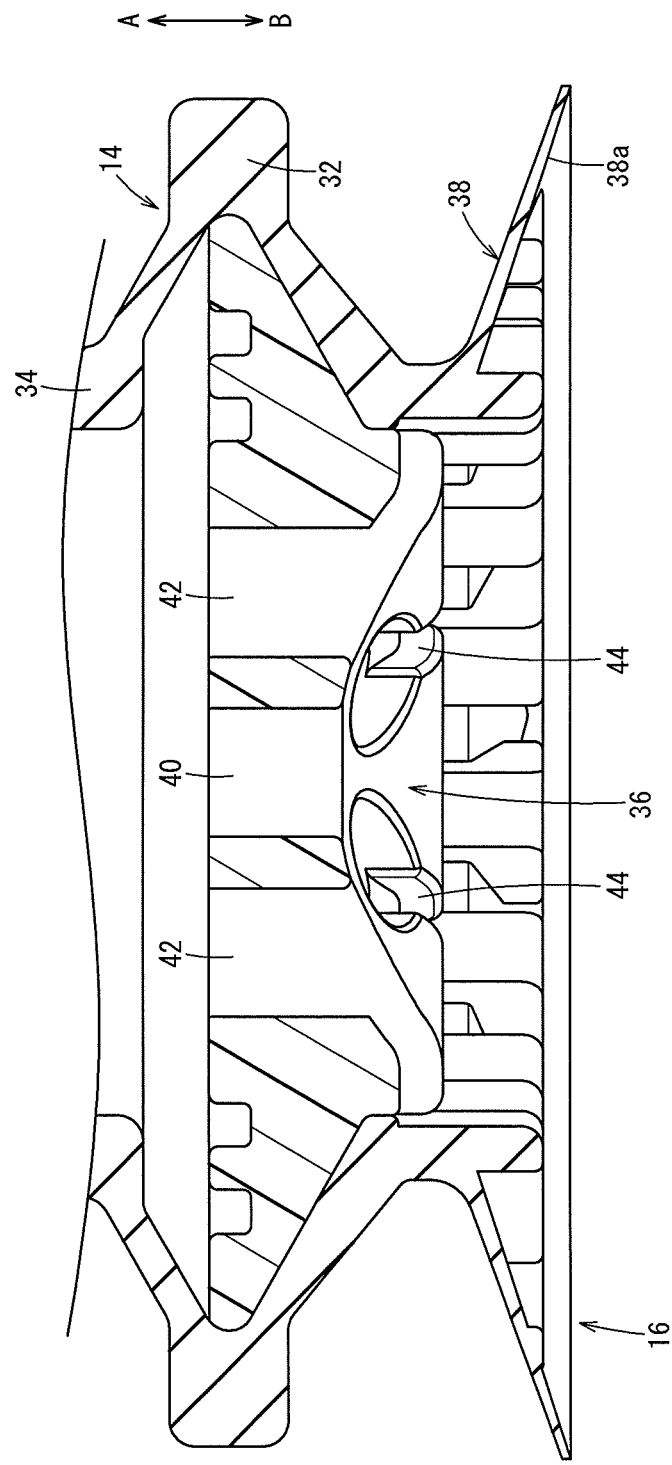
FIG. 2 is an enlarged cross-sectional view of a pad member in the suction device of FIG. 1.

As shown in FIGS. 1 to 4, the suction device 10 includes an adapter (body) 12 connected through a tube to a non-illustrated negative pressure supply device, a bellows (bellows portion) 14 connected to a lower end of the adapter 12, and a pad member (suction member) 16 formed at the distal end (lower end) of the bellows 14.

The adapter 12 is formed, for example, in a cylindrical shape from a metal material, and on a lower end thereof, a connecting part 18 is formed to which the bellows 14 is connected, whereas on an upper end thereof, a threaded portion 22 is formed to which a joint 20 is connected. Between the connecting part 18 and the threaded portion 22, a flange portion 24 is formed that projects in a direction perpendicular to the axial direction. In addition, a seal ring 26 is attached to the flange portion 24 via an annular groove on an end surface on the side of the threaded portion 22. Moreover, when the joint 20 is connected to the adapter 12, the joint 20 abuts against the seal ring 26, thereby preventing the negative pressure fluid from leaking between the two members.

Further, a supply passage (passage) 28 is formed in the interior of the adapter 12 along the axial direction (the direction of arrows A and B) so as to penetrate through the connecting part 18, the flange portion 24, and the threaded portion 22. The negative pressure fluid, which is supplied from the negative pressure supply device (not shown) to the tube and the joint 20 connected to the threaded portion 22, is supplied to the supply passage 28.

The bellows 14 is formed in a cylindrical shape, for example, from elastic rubber or the like, and has an expandable/contractible and bendable bellows structure. The bellows 14 has, on an upper end thereof, a cylindrical portion 30 which is formed in a cylindrical shape with a constant diameter, and by being mounted in a manner so as to cover the connecting part 18 of the adapter 12, the cylindrical portion 30 is connected coaxially to the lower end of the adapter 12.

Further, annular peak portions 32 that are expanded in diameter and annular valley portions 34 that are contracted in diameter are formed alternately along the axial direction (the direction of arrows A and B) on the bellows 14. The pad member 16, which is placed in contact to the workpiece W (see FIG. 5A) and applies suction thereto, is formed integrally on the lower end of the bellows.

Moreover, the interior of the bellows 14 which is formed in a hollow shape functions as a flow path through which the negative pressure fluid is supplied and flows.

The pad member 16 is provided at the lower end of the bellows 14, and includes an attachment 36 disposed substantially in the center, and a skirt 38 provided on the outer circumferential side of the attachment 36.

The upper end of the attachment 36 is formed in a conical shape which is gradually expanded in diameter in an upward direction (the direction of the arrow A), and is engaged with the lowermost annular peak portion 32 in the bellows 14, and is thereby held integrally in the center of the lower end of the bellows 14.

Further, a center of the lower end of the attachment 36 is formed with a circular arcuate shape in cross section which is shaped convexly toward a direction (the direction of the arrow A) separating away from the workpiece W, and a first communication hole 40 and a plurality of second communication holes 42 are formed to penetrate in the axial direction (the direction of arrows A and B) through the attachment 36.

Figure 3:
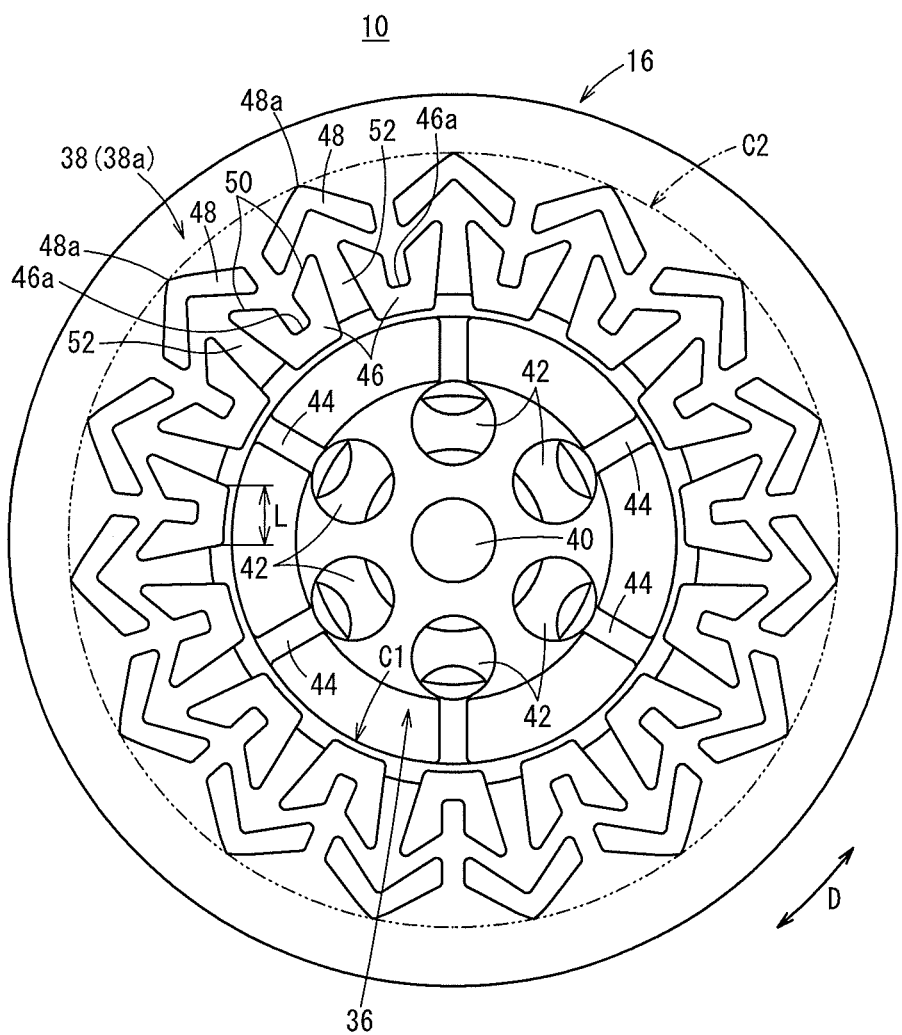
FIG. 3 is a front view of the suction device as viewed from the side of the pad member of FIG. 2.
Figure 4:
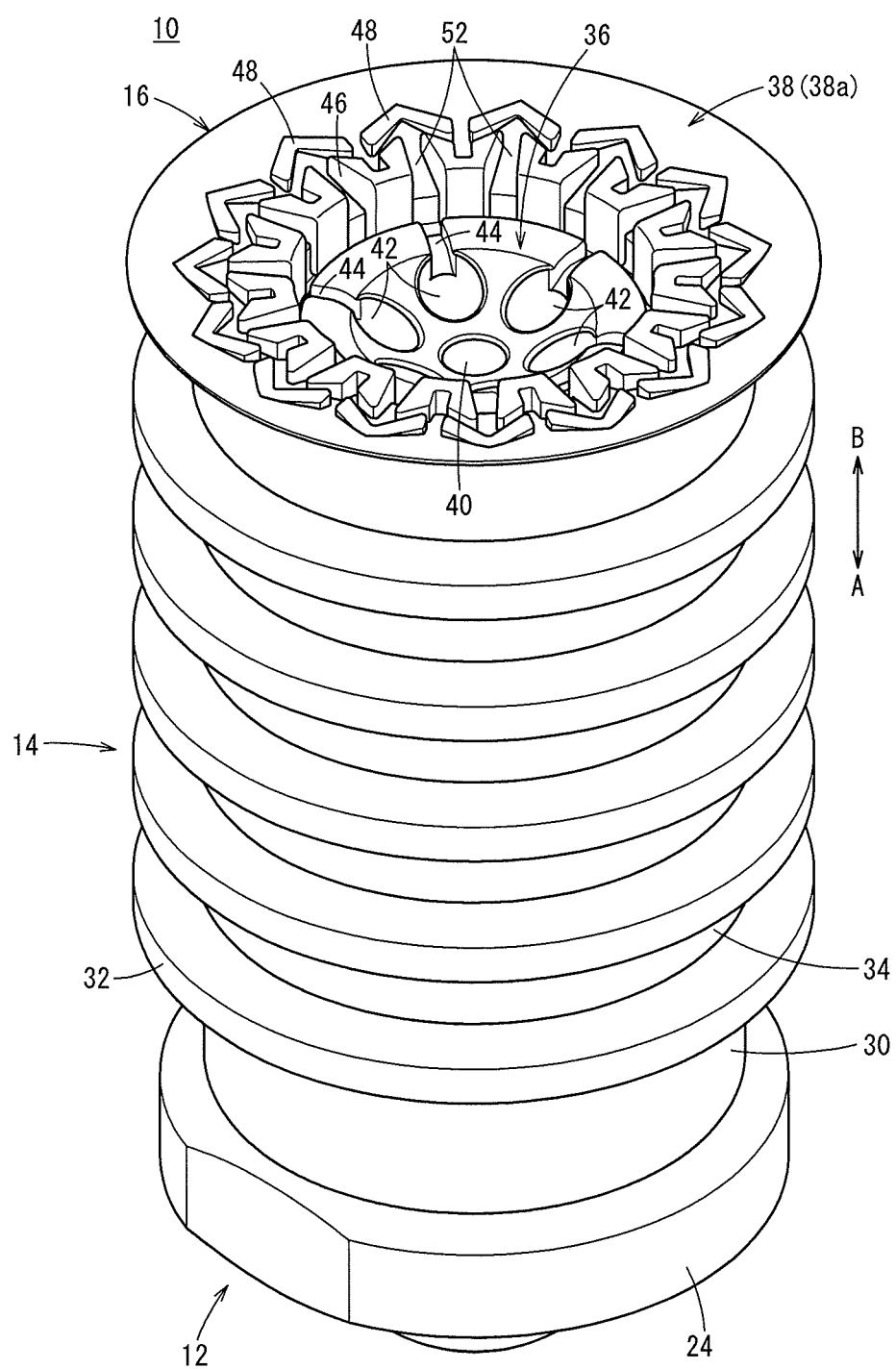
FIG. 4 is an external perspective view of the suction device shown in FIG. 1.

As shown in FIGS. 3 and 4, the first communication hole 40 is disposed in the axial center of the attachment 36, and the six second communication holes 42 are arranged at equal intervals from one another on a circumference of a predetermined diameter centered about the first communication hole 40. Stated otherwise, the attachment 36 is provided with seven communication holes in total. It should be noted that the number of the second communication holes 42 is not necessarily limited to six as described above.

Furthermore, on the lower end of the attachment 36, guide grooves 44 are formed that extend outwardly in radial directions from each of the second communication holes 42. The guide grooves 44 are formed with U-shapes in cross section opening toward the workpiece W (in the direction of the arrow B). The guide grooves 44 are provided so as to allow the second communication holes 42 to communicate with the skirt 38 that is disposed on the outer circumferential side of the attachment 36. Stated otherwise, the guide grooves 44 are formed in a recessed manner upwardly (in the direction of the arrow A) from a lower surface of the attachment 36.

The skirt 38 is formed, for example, in a thin film annular shape from rubber or the like having an elasticity similar to that of the bellows 14, and is formed so as to spread out obliquely downward, together with being formed to be freely flexible. Moreover, the skirt 38 may be formed by way of two-color molding or the like using a material that differs from that of the bellows 14.

Further, on the skirt 38, on an inner surface (suction surface) 38a where a distal end thereof forms a location in contact with the workpiece W, and which is on the side of the workpiece W (in the direction of the arrow B), there are provided a plurality of first ribs (first rib portions) 46 formed so as to face an outer edge portion of the attachment 36, and a plurality of second ribs (second rib portions) 48 disposed on an outer circumferential side with respect to the first ribs 46. The first and second ribs 46 and 48 are formed so as to project at respective predetermined heights toward the workpiece W with respect to the inner surface 38a of the skirt 38. A case will be described in which fifteen first ribs 46 and fifteen second ribs 48 are provided on the skirt 38.

As shown in FIG. 3, the first ribs 46 are formed with V-shapes (concave shapes) in cross section having bottom portions on the inner circumferential side and opening toward the outer circumferential side of the skirt 38 as viewed from the axial direction of the suction device 10. At bifurcated outer circumferential side end portions on the outer circumferential side, inclined portions 50 are formed which are inclined toward the central recesses 46a. More specifically, each of the first ribs 46 is formed in a manner so that one of the inclined portions 50 and the other of the inclined portions 50 form a pair in a symmetrical shape with the recess 46a being interposed therebetween.

Additionally, the plurality of first ribs 46 are arranged at equal intervals from one another along the circumferential direction (the direction of the arrow D) of the skirt 38, and supply paths 52 to which the negative pressure fluid is supplied are formed between two adjacent ones of the first ribs 46. The first ribs 46 and the supply paths 52 extend radially along radial directions of the skirt 38.

Further, the guide grooves 44 of the attachment 36 are disposed so as to face toward inner sides of the first ribs 46 and the supply paths 52.

As shown in FIG. 3, the second ribs 48 are formed with V-shapes (concave shapes) in cross section, which are bent to project toward the outer circumferential side of the skirt 38 as viewed from the axial direction of the suction device 10. Among two of the first ribs 46, which are arranged adjacent to each other, each of the second ribs 48 is arranged so as to straddle over an outer circumferential side end portion of one of the first ribs 46 and an outer circumferential side end portion of another of the first ribs 46. More specifically, concerning the second ribs 48, central portions thereof, which face toward the supply paths 52 formed between adjacent ones of the first ribs 46, make up top portions 48a that project maximally toward the outer circumferential side of the skirt 38, and from the top portions 48a toward both ends thereof, the second ribs 48 are formed in an inclined manner toward insides in radial directions, respectively, so as to gradually approach toward the outer circumferential side end portions of the first ribs 46.

The angles of inclination centered about the top portions 48a of the second ribs 48 are formed to be substantially the same as the angles of inclination of the inclined portions 50 of the first ribs 46.

Further, as shown in FIG. 3, a total length of the lengths L of the inner circumferential side ends (bottom portions) of the first ribs 46 along the circumferential direction is set to lie within a range of from 40% to 70% of an inner circumference (length) C1 of the skirt 38, and together therewith, is set to be less than or equal to 40% of a circumference (length) C2 of a circumscribed circle passing through the top portions 48a forming the outermost circumference on the second ribs 48.

Furthermore, the total area of the first and second ribs 46 and 48 as viewed from the axial direction of the suction device 10 is set to lie within a range of from 5% to 40% of the surface area of the skirt 38.

The suction device 10 according to the first embodiment of the present invention is constructed basically as described above. Next, operations and advantages thereof will be described. In this instance, as shown in FIGS. 5A and 5B, a description will be given concerning a case in which a workpiece W formed of a thin film in a bag shape and in which fluid contents are contained in the interior thereof is attracted under suction and transported.

First, the suction device 10 is attached to an arm or the like of a non-illustrated transport apparatus, and is disposed in a displaceable manner, together with the adapter 12 being connected via the tube and the joint 20 to a non-illustrated negative pressure supply device.

Figure 5A:
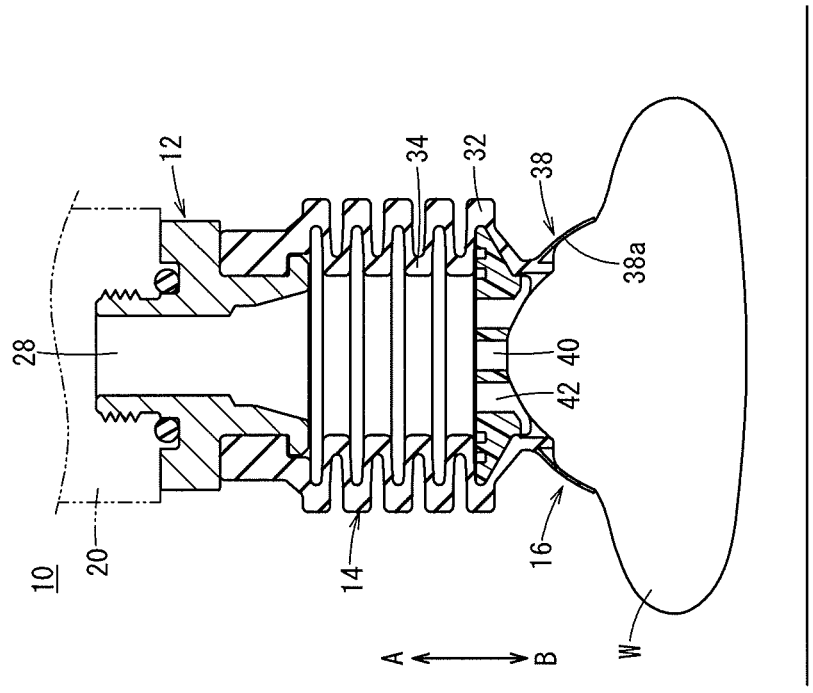
FIG. 5A is an explanatory diagram of operations, showing a state in which the pad member of the suction device is in abutment against a placed workpiece.
Figure 5B:
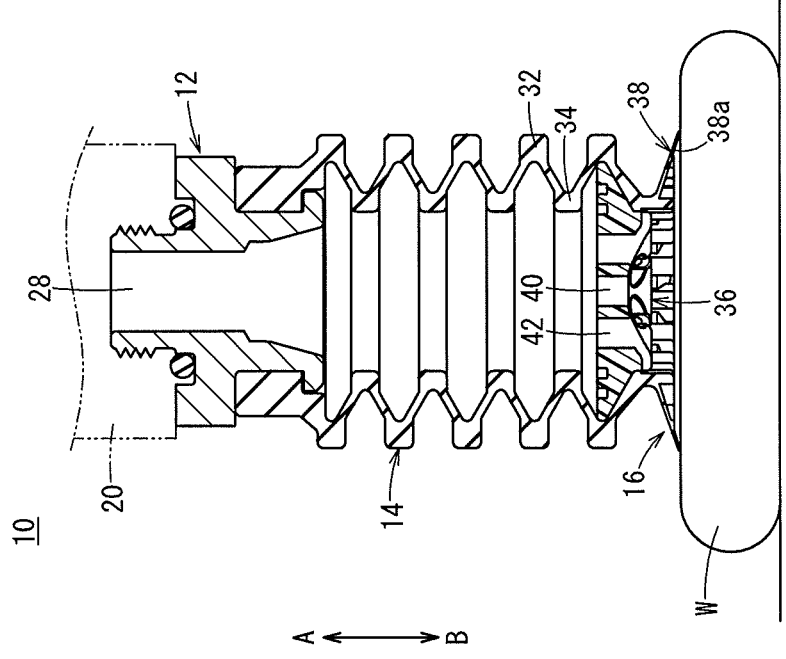
FIG. 5B is an explanatory diagram of operations, showing a state in which the workpiece is attracted under suction and moved upwardly by the suction device of FIG. 5A.

After having completed such preparatory operations, as shown in FIG. 5A, based on operations of the arm of the non-illustrated transport apparatus, the suction device 10 is displaced downward (in the direction of the arrow B), and the skirt 38 is placed in close contact with an upper part of the workpiece W, together with supplying a negative pressure fluid from the non-illustrated negative pressure supply device to the supply passage 28 of the adapter 12 via the tube and the joint 20.

At this time, since the workpiece W is placed on a floor surface or the like, the upper surface thereof that faces toward the suction device 10 is substantially flat, and for example, even in the case that the workpiece W is inclined, or when the upper part of the workpiece W is not flat, by an expanding/contracting operation of the bellows 14 corresponding to the workpiece W, it is possible to follow the workpiece W and to securely place the pad member 16 in close contact therewith.

Consequently, the skirt 38 of the pad member 16 is placed in close contact with the surface of the workpiece W, and the negative pressure fluid supplied to the supply passage 28 of the adapter 12 passes through the interior of the bellows 14 and is supplied to the internal space of the pad member 16 from the first and second communication holes 40 and 42 of the attachment 36. Further, a portion of the negative pressure fluid supplied to the second communication holes 42 passes through the guide grooves 44 and flows to the side of the skirt 38 on the outer circumferential side thereof, and flows to the outer circumferential side along the respective supply paths 52. As a result, the upper part of the workpiece W that is placed in close contact with the skirt 38 is attracted under suction to the pad member 16 by the negative pressure fluid, and simultaneously, the bellows 14 undergoes contraction in the axial direction. At this time, since the outer edge portion of the skirt 38 is held in close contact with the flat shaped upper part of the workpiece W, the negative pressure fluid supplied to the outer circumferential side along each of the supply paths 52 does not leak to the exterior, and the suction force applied with respect to the workpiece W is maintained.

Then, as shown in FIG. 5B, in a state in which the workpiece W is attracted under suction by the suction device 10, by causing the workpiece W to be moved upwardly (in the direction of the arrow A) by the arm of the non-illustrated transport apparatus, the workpiece W becomes deformed so as to bend downward in the direction of gravity (the direction of the arrow B) due to the weight of the contents, and accordingly, the skirt 38 elastically deforms so as to follow the shape of the upper part of the workpiece W that is attracted under suction, and becomes a downwardly bent curved shape.

Figure 6:
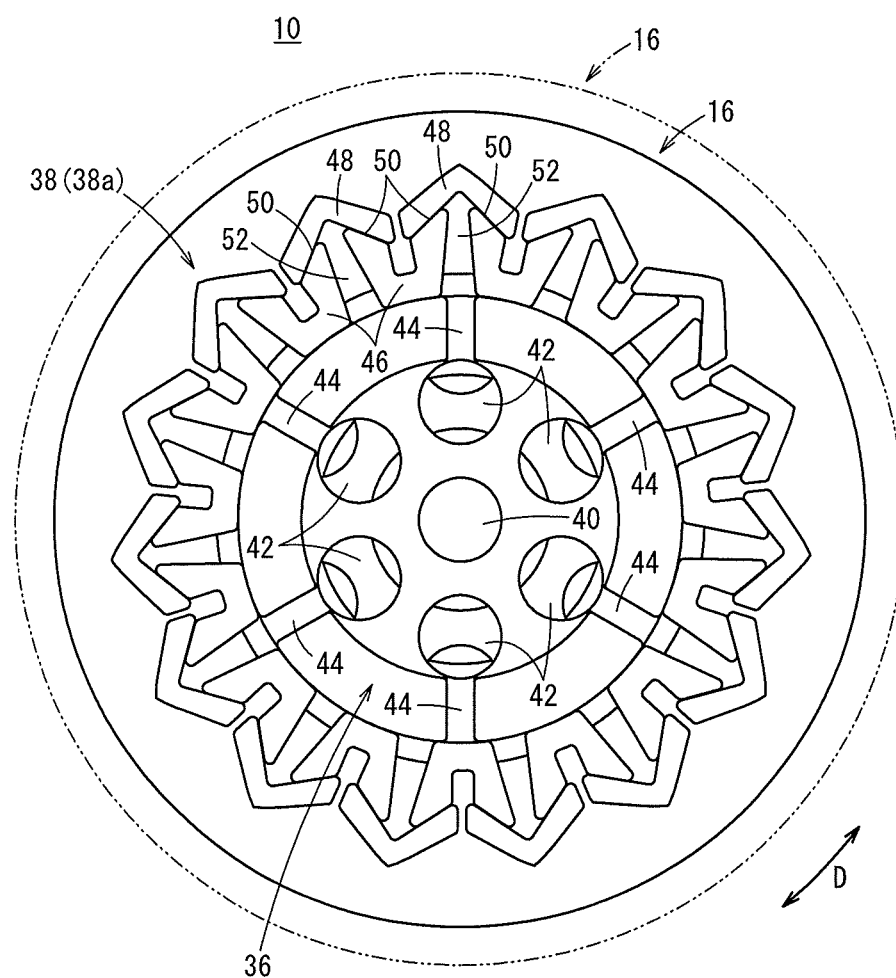
FIG. 6 is a front view of the pad member in a state in which the workpiece of FIG. 5B is attracted under suction.

In this manner, in the case that the shape of the workpiece W changes during conveyance of the workpiece W, then as shown in FIG. 6, accompanying the elastic deformation of the skirt 38, the plurality of first ribs 46 approach toward each other in the circumferential direction (the direction of the arrow D), and the second ribs 48 approach toward the outer circumferential side end portions of the first ribs 46 and come into abutment against the outer circumferential side end portions, together with the first ribs 46 and the second ribs 48 approaching toward each other in the radial direction, whereby a state is brought about in which the outer circumferential sides of the supply paths 52 are blocked by the second ribs 48.

Furthermore, accompanying the elastic deformation of the skirt 38, by both ends of the second ribs 48 undergoing bending so as to approach toward each other, it is possible for the second ribs 48 to abut against the inclined portions 50 of the first ribs 46 and thereby block the supply paths 52.

Therefore, the negative pressure fluid, which is supplied toward the outer circumferential side through each of the supply paths 52 in the skirt 38, does not flow any further toward the outer circumferential side from the supply paths 52 due to the second ribs 48, and the negative pressure fluid is retained within the supply paths 52 that are surrounded by the second ribs 48 and the first ribs 46, whereby the deformed upper part of the workpiece W is reliably and suitably attracted under suction by the negative pressure fluid that is retained inside the respective supply paths 52.

Stated otherwise, the skirt 38 undergoes elastic deformation in accordance with the change in shape of the workpiece W, and the workpiece W is attracted under suction by the negative pressure fluid inside the respective supply paths 52, thereby making it possible to prevent a decrease in the suction force and avoid the occurrence of a suction defect.

Further, even in the case that the lower surface of the attachment 36 is covered by the attracted workpiece W, the negative pressure fluid is securely supplied to the respective supply paths 52 of the skirt 38 by the guide grooves 44 that communicate with the second communication holes 42 and extend toward the outer circumferential side, thereby enabling the suction power applied with respect to the workpiece W to be maintained.

In addition, after the suction device 10 to which the workpiece W is attracted under suction has been transported to a predetermined position by an arm of the transport apparatus, supply of the negative pressure fluid with respect to the supply paths 52 is stopped, whereby the attracted state of the workpiece W by the pad member 16 of the suction device 10 is released.

In the foregoing manner, according to the first embodiment, the pad member 16 that constitutes the suction device 10 comprises the attachment 36 to which the negative pressure fluid is supplied, and the elastically deformable skirt 38 disposed on the outer circumferential side of the attachment 36 and which is in the form of a thin film, wherein on the inner surface 38a of the skirt 38 to which the workpiece W is attracted under suction, there are provided the plurality of first ribs 46, which are formed on the outer circumferential side of the attachment 36 and extend radially, and the plurality of second ribs 48, which are formed on the outer circumferential side of the first ribs 46 and are disposed in a circumferentially offset manner (in the direction of the arrow D) with respect to the first ribs 46, together with the first and second ribs 46 and 48 being formed to project toward the workpiece W.

Consequently, for example, when a bag-shaped workpiece W in which fluid contents are contained is attracted under suction and transported by the suction device 10, even in the case that during conveyance thereof the shape of the workpiece W changes due to movement of the contents or under the influence of gravity or the like, the skirt 38 is elastically deformed in a manner so as to follow the shape of the workpiece W, and accompanying such elastic deformation, the second ribs 48 cover the outer circumferential side end portions of the first ribs 46. Therefore, the negative pressure fluid supplied to the supply paths 52 formed between the first ribs 46 is prevented from flowing toward the outer circumferential side of the skirt 38 and leaking to the exterior.

As a result, even in the case that the shape of the workpiece W changes during conveyance by the suction device 10, the skirt 38 undergoes deformation corresponding to the change in shape, thereby securely placing the skirt in close contact with the workpiece W, and enabling the negative pressure fluid to be reliably retained in the supply paths 52 in the form of closed spaces which are blocked on the outer circumferential side thereof by the second ribs 48. Therefore, the suction force with respect to the workpiece W can be maintained, and the workpiece W can continue being reliably attracted under suction in a stable manner.

Further, in the skirt 38, since the first ribs 46 and the second ribs 48 are disposed so as to overlap one another in the radial direction, in the case that the attracted and transported workpiece W is deformed and the skirt 38 accordingly undergoes deformation accompanying the deformation of the workpiece W, the outer circumferential side end portions of the first ribs 46 and the second ribs 48 are suitably brought into contact with each other, thereby reliably blocking the supply paths 52 provided between both members, and enabling the negative pressure fluid to be retained inside the supply paths 52. Therefore, even in the case that the workpiece W that is attracted under suction undergoes deformation, the suction force is not reduced, and the workpiece W can be reliably attracted under suction and transported.

Furthermore, the inclined portions 50 are provided on the outer circumferential side end portions of the first ribs 46 that are formed with V-shapes in cross section, and the second ribs 48 that face toward the first ribs 46 are formed with V-shapes in cross section opening toward the inner circumferential side. Owing to this configuration, in the case that the workpiece W which is attracted under suction is deformed, and the skirt 38 undergoes deformation along therewith, the inclined portions 50 of the first ribs 46 can be securely brought into close contact with the second ribs 48 to thereby block the supply paths 52.

Therefore, it is possible to more reliably prevent leakage of the negative pressure fluid from the interior of the supply paths 52, and to increase the suction force applied with respect to the workpiece W.

Still further, the first and second ribs 46 and 48 are formed so as to have V-shapes in cross section, so that it becomes easy for the skirt 38 to be bent when it is deformed. Further, by arranging the plurality of divided first and second ribs 46 and 48 along the circumferential direction (the direction of the arrow D), compared to a case in which the first and second ribs of single type are provided, deformation of the skirt 38 can be easily brought about, and it is possible to smoothly and freely cause the skirt 38 to undergo deformation so as to follow the change in shape of the workpiece W.

Further still, the attachment 36 is provided with the guide grooves 44 having U-shapes in cross section, which communicate with the respective second communication holes 42 and extend radially outward. Therefore, when the workpiece W is attracted under suction, even in the case that a portion of the thin film workpiece W is brought into close contact with the attachment 36 so as to cover the attachment 36, and the second communication holes 42 are blocked, since the negative pressure fluid supplied to the second communication holes 42 can be reliably and stably supplied through the guide grooves 44 to the skirt 38 on the outer circumferential side, the suction force of the workpiece W can be maintained, and it is possible to avoid the occurrence of a suction defect.

Still further, by providing the plurality of first and second ribs 46 and 48 on the skirt 38, the rigidity of the skirt 38 can be enhanced, and accordingly, drawing in of the skirt 38 itself with respect to the first and second communication holes 40 and 42 can be prevented.

Further, by providing the bellows 14 between the adapter 12 and the pad member 16, it is possible to suitably alleviate shocks when the suction device 10 is placed in contact with the workpiece W.

Furthermore, the skirt 38 and the bellows 14 may be formed separately from different materials, and the hardness of the bellows 14 may be set to be higher than the hardness of the skirt 38.

Figure 7:
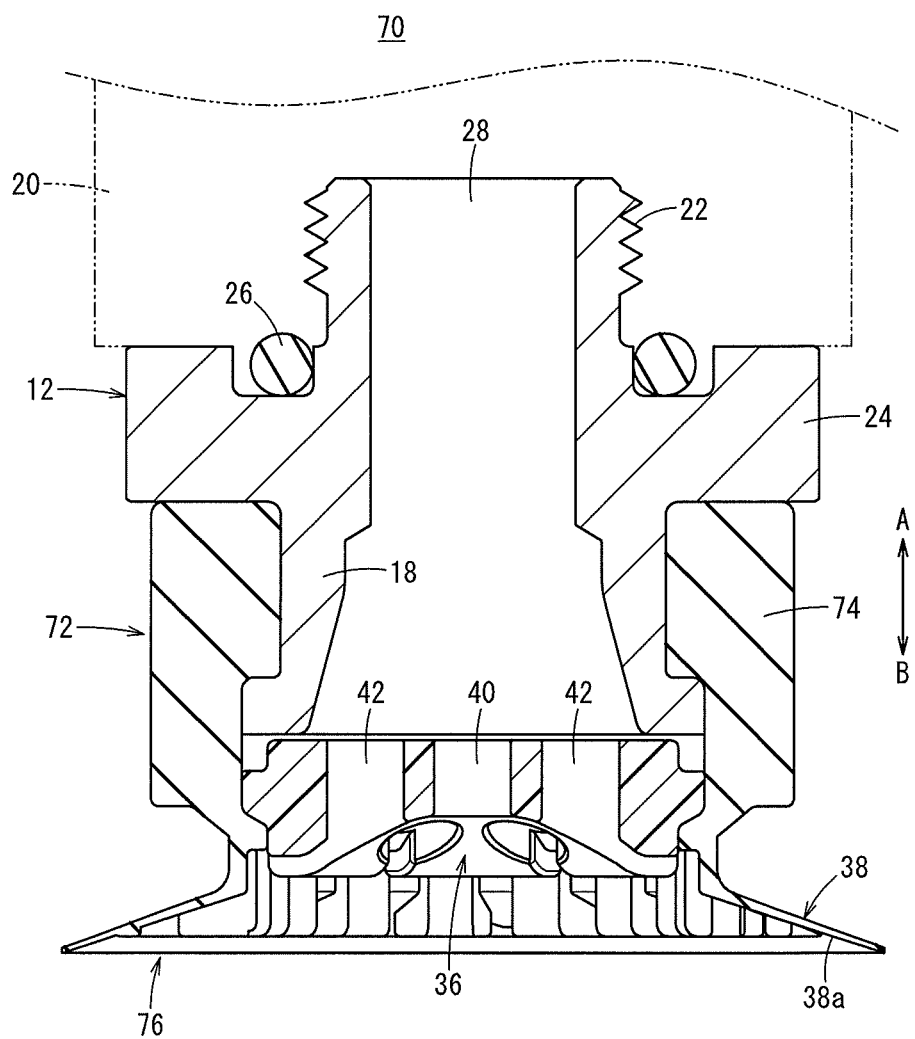
FIG. 7 is an overall cross-sectional view of a suction device including a suction pad according to a second embodiment of the present invention.
Figure 8:
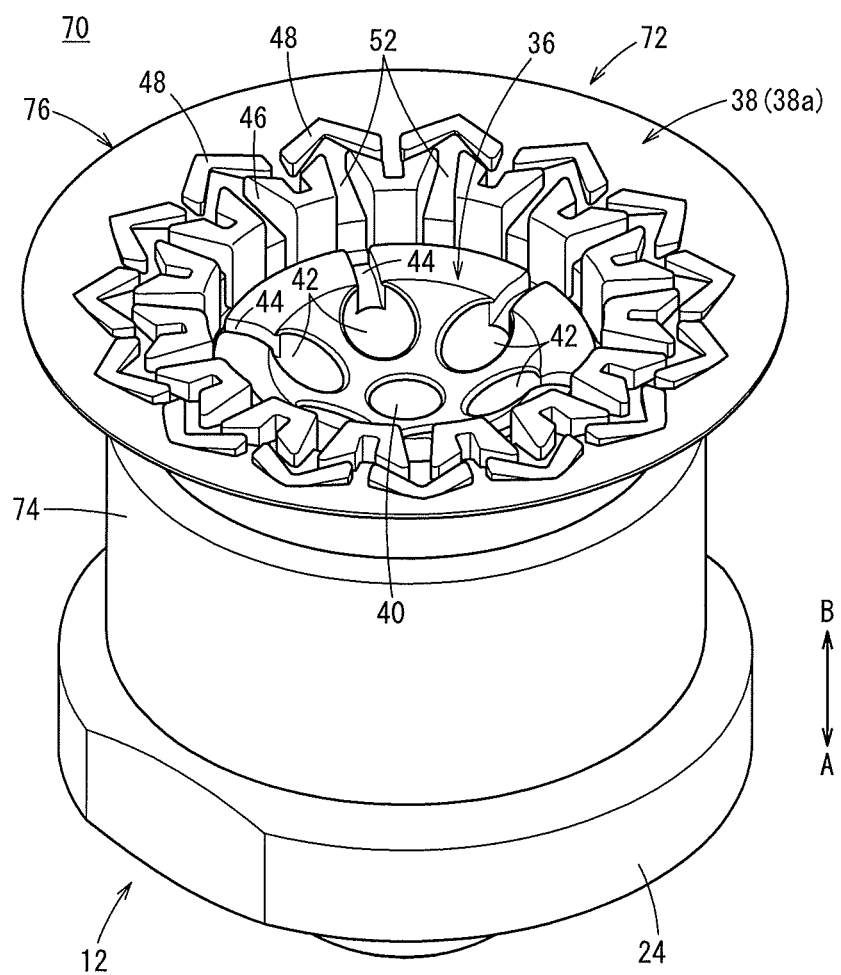
FIG. 8 is an external perspective view of the suction device shown in FIG. 7.

Next, a suction device 70 according to a second embodiment is shown in FIGS. 7 and 8. The same reference numerals are used to indicate the same constituent elements as those of the suction device 10 according to the above-described first embodiment, and detailed description of such features is omitted.

The suction device 70 according to the second embodiment differs from the suction device 10 according to the first embodiment, in that a suction pad 72 thereof is directly connected to the lower end of the adapter 12.

In the suction device 70, the suction pad 72 which is made of an elastic material is connected to the connecting part 18 provided at the lower end of the adapter 12. Moreover, in relation to the adapter 12, it has the same configuration as that of the suction device 10 according to the first embodiment, and therefore, detailed description of the adapter 12 will be omitted.

The suction pad 72 includes on an upper end thereof a cylindrical portion 74 which is formed in a cylindrical shape, and by being mounted in a manner so as to cover the connecting part 18 of the adapter 12, the cylindrical portion 74 is connected coaxially with respect to the lower end of the adapter 12.

Further, the pad member 76 that attracts the workpiece W under suction is formed at the lower end of the suction pad 72, the pad member 76 being constituted from the attachment 36 disposed substantially in the center, and the skirt 38 provided on the outer circumferential side of the attachment 36. The plurality of first and second ribs 46 and 48 are provided on the skirt 38. In relation to the skirt 38, it has the same configuration as that of the suction device 10 according to the first embodiment, and therefore, detailed description of the skirt 38 will be omitted.

In the manner described above, with the suction device 70 according to the second embodiment, in comparison with the suction device 10 according to the first embodiment, since the bellows 14 having a bellows shape is not included therein, it is possible to make the dimension in the axial direction (the direction of arrows A and B) smaller.

Figure 9A:
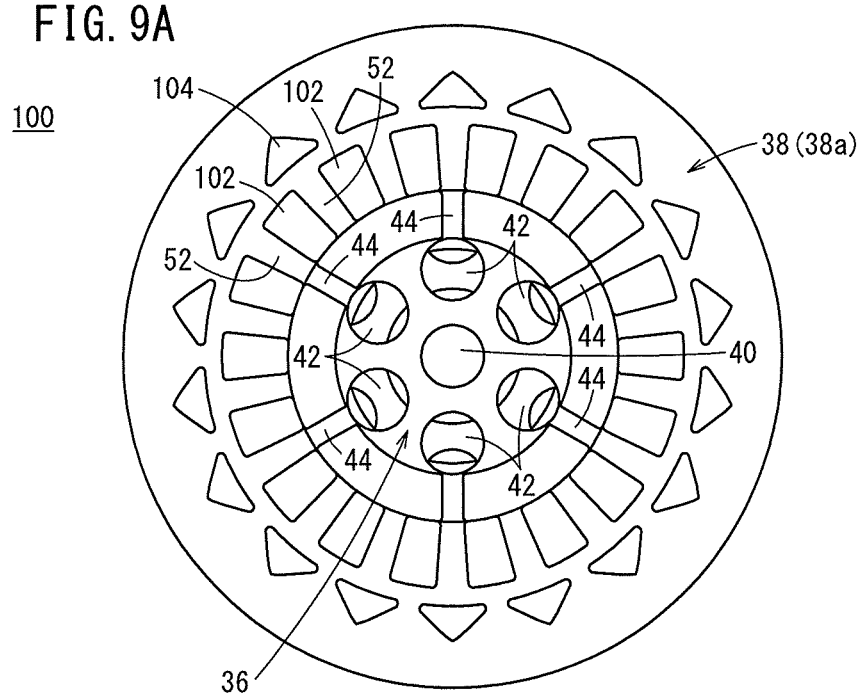
FIG. 9A is a front view of a suction device according to a modification, as viewed from a side of the pad member.

Further, the first and second ribs 46 and 48 provided on the skirt 38 of the suction devices 10 and 70 are not limited to having the shapes described above. For example, as in the suction device 100 shown in FIGS. 9A and 9B, the ribs may be constituted from a plurality of first ribs 102 that extend in a linear manner radially outward from the side of the attachment 36 that is located in the center of the skirt 38, and a plurality of second ribs 104 disposed on the outer circumferential side of the first ribs 102, and disposed so as to face the supply paths 52 formed between adjacent ones of the first ribs 102.

The first ribs 102 and the second ribs 104 are disposed in a manner so that portions thereof overlap each other in the radial direction of the skirt 38.

Figure 9B:
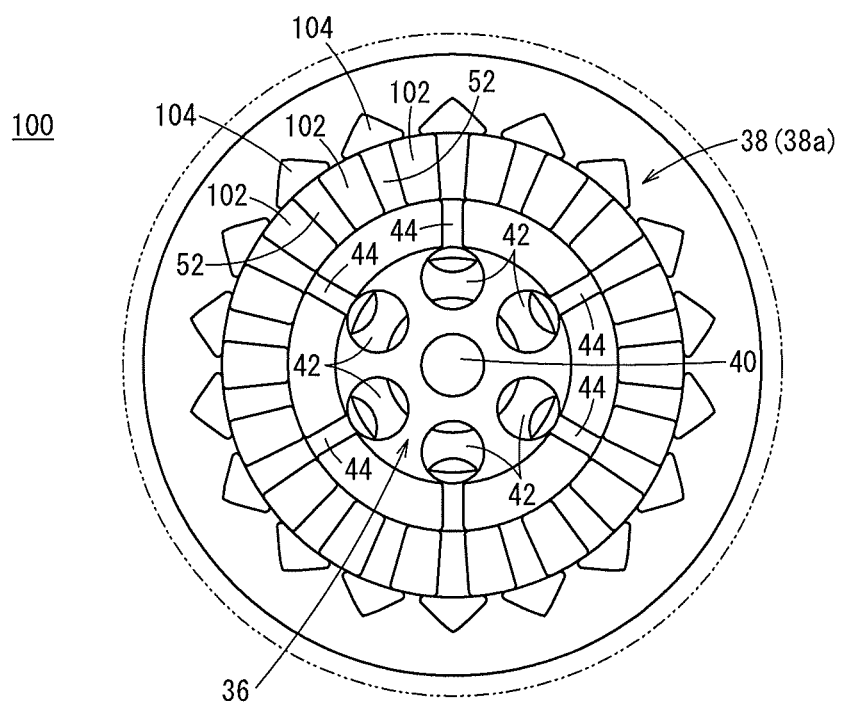
FIG. 9B is a front view when a workpiece is attracted under suction by the suction device of FIG. 9A.

Even in this case, in a state in which the workpiece W is attracted under suction by the suction device 100, as shown in FIG. 9B, in the case that the skirt 38 is deformed accompanying a change in the shape of the workpiece W, by the second ribs 104 coming into abutment against the outer circumferential side end portions of each two adjacent ones of the first ribs 102, the negative pressure fluid can be suitably retained in the interior by reliably blocking the outer circumferential sides of the supply paths 52 provided between the first ribs 102 and to which the negative pressure fluid is supplied.

As a result, when the workpiece W is attracted under suction and transported, even in the case that the shape of the workpiece W changes, the suction force can be stably maintained by the negative pressure fluid that is retained inside the supply paths 52, and it becomes possible to transport the workpiece W in a state of being securely attracted under suction without the occurrence of a suction defect.

More specifically, the first ribs 46 and 102 and the second ribs 48 and 104 are not limited to the shapes described above, and any configuration may be adopted which is capable of maintaining the negative pressure inside the supply paths 52 by the outer circumferential side end portions of the first ribs 46 and 102 being blocked by the second ribs 48 and 104 when the skirt 38 undergoes elastic deformation in accordance with a change in the shape of the workpiece W.

The suction pad according to the present invention is not limited to the embodiments described above. It is a matter of course that various alternative or additional configurations could be adopted therein without departing from the essence and gist of the present invention as set forth in the appended claims.

What is claimed is:
1. A suction pad configured to be fixed to an end of a body having therein a passage to which a negative pressure fluid is supplied, the suction pad including:
 a suction member having a suction surface to which a workpiece may be attracted under suction;
 a plurality of first rib portions arranged circumferentially around the passage and configured to extend radially outward and to project from the suction surface of the suction member toward the workpiece being attracted thereto under suction, wherein adjacent ones of the first rib portions are circumferentially spaced from one another to form supply paths through which the negative pressure fluid can flow; and
 a plurality of second rib portions facing outer circumferential sides of the first rib portions, wherein the second rib portions are circumferentially offset with respect to the first rib portions such that a radial line extending along one of the supply paths and passing between the adjacent ones of the first rib portions intersects one of the second rib portions,
 wherein at least parts of the second rib portions are disposed so as to face toward directions in which the supply paths extend.

2. The suction pad according to claim 1, wherein parts of the first rib portions and parts of the second rib portions are arranged to overlap each other in radial directions of the suction member.

3. The suction pad according to claim 1, wherein the first and second rib portions are provided at equal intervals from one another along a circumferential direction of the suction member.

4. The suction pad according to claim 1, wherein the first rib portions are formed with concave shapes in cross section opening toward an outer circumferential side of the suction member, and the second rib portions are formed with concave shapes in cross section opening toward an inner circumferential side on a side of the first rib portions.

5. The suction pad according to claim 1, wherein the suction member further comprises:
an attachment provided in a center of the suction member, and to which the negative pressure fluid is supplied; and
a skirt which is elastically deformable and disposed on an outer circumferential side of the attachment, the skirt having the suction surface to which the workpiece may be attracted under suction;
wherein the skirt is disposed to be freely flexible about the attachment with the attachment acting as a supporting point.

6. The suction pad according to claim 5, wherein the skirt is formed in an annular shape, a sum of lengths of the plurality of first rib portions along a circumferential direction thereof is set to lie within a range of from 40% to 70% of an inner circumference of the skirt, and is set to be less than or equal to 40% of a circumference of an outer circumscribed circle in contact with outer circumferential end portions of the second rib portions, and a total area of the first and second rib portions as viewed from an axial direction of the body and the suction member is set to lie within a range of from 5% to 40% of an area of the skirt.

7. The suction pad according to claim 5, wherein the suction member comprises a bellows portion which is formed in a bellows shape and is expandable and contractible in an axial direction, and the skirt having the suction surface to which the workpiece may be attracted under suction is formed integrally on an end of the bellows portion, wherein the bellows portion and the skirt are formed from different materials.

8. The suction pad according to claim 7, wherein a hardness of the bellows portion is set to be higher than a hardness of the skirt.

9. The suction pad according to claim 5, wherein communication holes provided in communication with the passage of the body are formed in the attachment, and guide grooves that extend toward an outer circumferential side on a side of the skirt are formed in communication with the communication holes.

\* \* \* \* \*